(12) United States Patent
Gopalakrishnan et al.

(10) Patent No.: US 9,780,797 B2
(45) Date of Patent: *Oct. 3, 2017

(54) CMOS INTERPOLATOR FOR A SERIALIZER/DESERIALIZER COMMUNICATION APPLICATION

(71) Applicant: INPHI CORPORATION, Santa Clara, CA (US)

(72) Inventors: Karthik S. Gopalakrishnan, Santa Clara, CA (US); Guojun Ren, San Jose, CA (US); Parmanand Mishra, Thousand Oaks, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/464,750

(22) Filed: Mar. 21, 2017

(65) Prior Publication Data

US 2017/0194970 A1 Jul. 6, 2017

Related U.S. Application Data

(60) Continuation of application No. 14/826,051, filed on Aug. 13, 2015, now Pat. No. 9,641,313, which is a
(Continued)

(51) Int. Cl.
*H03L 7/081* (2006.01)
*H03L 7/08* (2006.01)
*H04L 25/03* (2006.01)

(52) U.S. Cl.
CPC .......... *H03L 7/0812* (2013.01); *H03L 7/0807* (2013.01); *H04L 25/03273* (2013.01)

(58) Field of Classification Search
CPC .................. H03K 5/135; H03K 5/14; H03K 2005/00013; H03K 2005/00189;
(Continued)

(56) References Cited

U.S. PATENT DOCUMENTS 6,463,092 B1 * 10/2002 Kim ...................... G09G 5/006
370/284
8,063,686 B1 * 11/2011 Naviasky ............... H03K 5/135
327/144
(Continued)

OTHER PUBLICATIONS

Office Action for U.S. Appl. No. 13/802,620, dated Feb. 21, 2014.

*Primary Examiner* — Young T Tse
(74) *Attorney, Agent, or Firm* — Richard T. Ogawa; Ogawa P.C.

(57) ABSTRACT

The present invention relates generally to integrated circuits. More particularly, the present invention provides a circuit and method for regulating a voltage for a high speed serializer/deserializer (SerDes) device. But it will be recognized that the technique can be used for regulating memory devices (e.g., DDR 4 SDRAM devices, DDR4 register devices, DDR4 controller devices), and other high speed data applications. In various embodiments, phase-interpolator is implemented in conjunction with a delay-lock loop (DLL) and an SR latch, where one or more outputs of the DLL is used by the SR latch. Additionally, such techniques can be used for a variety of applications such as network and/or computer storage systems, computer servers, hand held computing devices, portable computing devices, computer systems, network appliances and/or switches, routers, and gateways, and the like.

12 Claims, 9 Drawing Sheets

Related U.S. Application Data continuation-in-part of application No. 14/637,308, filed on Mar. 3, 2015, now Pat. No. 9,203,605, which is a division of application No. 14/452,360, filed on Aug. 5, 2014, now Pat. No. 8,995,600, which is a continuation-in-part of application No. 13/802,248, filed on Mar. 13, 2013, now Pat. No. 8,824,616.

(60) Provisional application No. 61/617,896, filed on Mar. 30, 2012.

(58) Field of Classification Search
CPC ... H03K 2005/00286; H03L 7/06; H03L 7/07; H03L 7/08; H03L 7/0807; H03L 7/0812; H04L 7/0004; H04L 7/0008; H04L 7/002; H04L 7/0025; H04L 7/0033; H04L 7/0037; H04L 7/0331; H04L 25/03273

USPC ....... 375/219, 221, 222, 326–328, 371, 373, 375/376; 326/62–66, 80, 81, 93–99; 327/142, 146, 147, 152, 153, 155, 156, 327/161

See application file for complete search history.

(56) References Cited

U.S. PATENT DOCUMENTS

| | | |
|---|---|---|
| 8,395,446 B1 | 3/2013 | Tran |
| 8,610,476 B1 * | 12/2013 | Soh ..................... H03L 7/0807 327/159 |
| 2007/0121711 A1 | 5/2007 | Offord et al. |
| 2009/0289672 A1 * | 11/2009 | Hua ..................... H03L 7/07 327/147 |
| 2009/0304054 A1 | 12/2009 | Tonietto et al. |
| 2012/0189086 A1 | 7/2012 | Cai et al. |

* cited by examiner

CMOS INTERPOLATOR FOR A SERIALIZER/DESERIALIZER COMMUNICATION APPLICATION

CROSS-REFERENCES TO RELATED APPLICATIONS

This application is a continuation of U.S. patent application Ser. No. 14/826,051, filed Aug. 13, 2015, now U.S. Pat. No. 9,641,313, which is a continuation-in-part claiming priority to U.S. patent application Ser. No. 14/637,308, filed Mar. 3, 2015, entitled "CMOS INTERPOLATOR FOR A SERIALIZER/DESERIALIZER COMMUNICATION APPLICATION", now U.S. Pat. No. 9,203,605, which is divisional of U.S. patent application Ser. No. 14/452,360, filed Aug. 5, 2014, now U.S. Pat. No. 8,995,600, which is a continuation-in-part of U.S. patent application Ser. No. 13/802,248, filed Mar. 13, 2013, now U.S. Pat. No. 8,824,616, which claims priority to U.S. Provisional Application No. 61/617,896, filed Mar. 30, 2012, each of which are incorporated by reference herein.

BACKGROUND OF THE INVENTION

The present invention relates generally to integrated circuits. More particularly, the present invention provides a circuit and method for a CMOS interpolator for an output clock signal with a desirable phase for a high speed serializer/deserializer device. But it will be recognized that the technique can be used for regulating memory devices (e.g., DDR 4 SDRAM devices, DDR4 register devices, DDR4 controller devices), and other high speed data applications.

As integrated circuits are designed to operate at increasingly higher frequencies, noisy, distorted, and/or inconsistent signals can cause devices such as output drivers to produce poor quality output. Preferably, an output driver may provide a clean, symmetric, well-shaped output waveform even if the input signals are noisy or of poor quality. However, a driver may receive an asymmetric, low quality differential signal with a substantial and/or inconsistent amplitude variation and/or a common mode component. In many cases, the quality of the differential input signal may degrade with increased operating frequency. An eye diagram, constructed by overlaying the output voltage waveforms for many clock cycles, may be used indicate the fidelity or quality of a signal put through an electronic buffer circuit. A high quality output waveform may have an eye diagram with a symmetric shape that approaches the shape of a square wave. Often, it is desirable to have an output waveform with a centered or controllable crossing point (the point where the rising and falling signals intersect). The output crossing point may be characterized by the crossing point voltage. For a differential output, each of the output waveforms has an associated crossing point voltage.

From the above, it is seen that techniques for improving output waveforms and regulating them are highly desirable.

BRIEF SUMMARY OF THE INVENTION

The present invention relates generally to integrated circuits. More particularly, the present invention provides a circuit and method for regulating a voltage for a high speed serializer/deserializer (SerDes) device. But it will be recognized that the technique can be used for regulating memory devices (e.g., DDR 4 SDRAM devices, DDR4 register devices, DDR4 controller devices), and other high speed data applications. In various embodiments, phase-interpolator is implemented in conjunction with a delay-lock loop (DLL) and an SR latch, where one or more outputs of the DLL is used by the SR latch. Additionally, such techniques can be used for a variety of applications such as network and/or computer storage systems, computer servers, hand held computing devices, portable computing devices, computer systems, network appliances and/or switches, routers, and gateways, and the like.

According to an embodiment, the present invention provides an integrated transceiver circuit device. The device includes a plurality of receivers coupled to a plurality of channels. Each of the channels is configured for transmitting asynchronous data to one of the receivers. Each of the receivers includes a pre-amplifier device that has an input and an output. The input is coupled to a channel associated with the receiver. Each of the receivers also includes a comparator device that has an input coupled to the pre-amplifier, and the comparator is configured to identify one or more binary states. Each of the receivers additionally includes a phase interpolator device coupled to a receiver of the comparator device. The phase interpolator device is configured to perform a digital to phase conversion using information from the one or more binary states. The phase interpolator device includes a phase interpolator core and an SR latch and a delay loop. The SR latch includes an R input and an S input and an output. The S input is configured to receive signals from the interpolator core. The delay loop is coupled between the output of the SR latch and the R input. The delay loop is characterized by a phase shift of about 180 degrees. Each of the receivers also includes a clock data recovery (CDR) device coupled to an output of the comparator device and configured to drive the phase interpolator device to synthesize a frequency and phase of a signal from the output. The device includes a PLL device that is common to and being coupled to each of the phase interpolator devices.

According to another embodiment, the present invention provides a phase interpolator device. The device includes a PI core configured to interpolate from a first rising edge from a first clock and a second rising edge from a second clock. The device also includes a set of multiplexers coupled to a first input of the PI core. The device includes a latch device comprising an set (S) input and a reset (R) input. The S input is coupled to the PI core. The latch device also includes a Y and Y-Bar output. The device additionally includes an input for a digital word, and the input is coupled to the PI core. The device further includes a delay loop that has a delay line and a delay module. The delay loop is characterized by a phase shift of about 180 degrees and is configured between the Y output and the R input of the latch device. The Y and Y-Bar output of the latch device is operably responsive to each rising edge of the S input and the R input to output a clock signal having a fifty percent duty cycle on the Y and Y-Bar output.

According to another embodiment, the present invention provides a method of operating a telecommunication device. The method includes transferring a first clock signal and a second clock signal to a PI core. The PI core is configured to interpolate from a first rising edge from the first clock signal and a second rising edge from the second clock signal. The method also includes transferring information from the PI core to an S input of an SR latch device. The method additionally includes transferring a digital word to the PI core. Also, the method includes outputting a clock signal having a fifty percent duty cycle on Y and Y-Bar from the latch device responsive to each rising edge of the S input and the R input. Furthermore, the method includes transferring an output from the SR latch device to an R input of the SR latch device through a delay loop. The delay loop is characterized by a phase shift of about 180 degrees.

According to yet another embodiment, the present invention provides a phase interpolator device that includes a PI core configured to interpolate from a first rising edge from a first clock and a second rising edge from a second clock. The device also includes a set of multiplexers coupled to a first input of the PI core. The device further includes a latch device comprising an set (S) input and a reset (R) input. The S input is coupled to the PI core. The latch device has a Y and Y-Bar output. The device additionally includes an input for a digital word. The input is coupled to the PI core. The device also includes a delay loop that has a delay line and a delay module. The delay loop being characterized by a phase shift of about 180 degrees and configured between the Y output and the R input of the latch device. The delay loop includes a low pass filter for extracting a DC voltage of the Y output. The delay loop also includes an OTA that is configured to generate a switching signal based on a comparison of the DC voltage and a reference voltage. The delay loop additionally includes a switch module that is configured to output the S input signal in response to the switching signal.

Benefits are achieved over conventional techniques. Depending upon the specific embodiment, one or more of these benefits may be achieved. In an example, the invention provides an efficient interpolator device configured for high speed communication devices. The invention can be implemented using conventional CMOS technologies, or the like. As described below, phase interpolators are typically expensive, both in power and device area. By using only a single phase interpolator core instead of two, the power consumption of a phase interpolator is further reduced. Of course, there can be other variations, modifications, and alternatives.

The present invention achieves these benefits and others in the context of known memory technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

The present invention relates generally to integrated circuits. More particularly, the present invention provides a circuit and method for regulating a voltage for a high speed serializer/deserializer (SerDes) device. But it will be recognized that the technique can be used for regulating memory devices (e.g., DDR 4 SDRAM devices, DDR4 register devices, DDR4 controller devices), and other high speed data applications. In various embodiments, phase-interpolator is implemented in conjunction with a delay-lock loop (DLL) and an SR latch, where one or more outputs of the DLL is used by the SR latch. Additionally, such techniques can be used for a variety of applications such as network and/or computer storage systems, computer servers, hand held computing devices, portable computing devices, computer systems, network appliances and/or switches, routers, and gateways, and the like.

Figure 1:
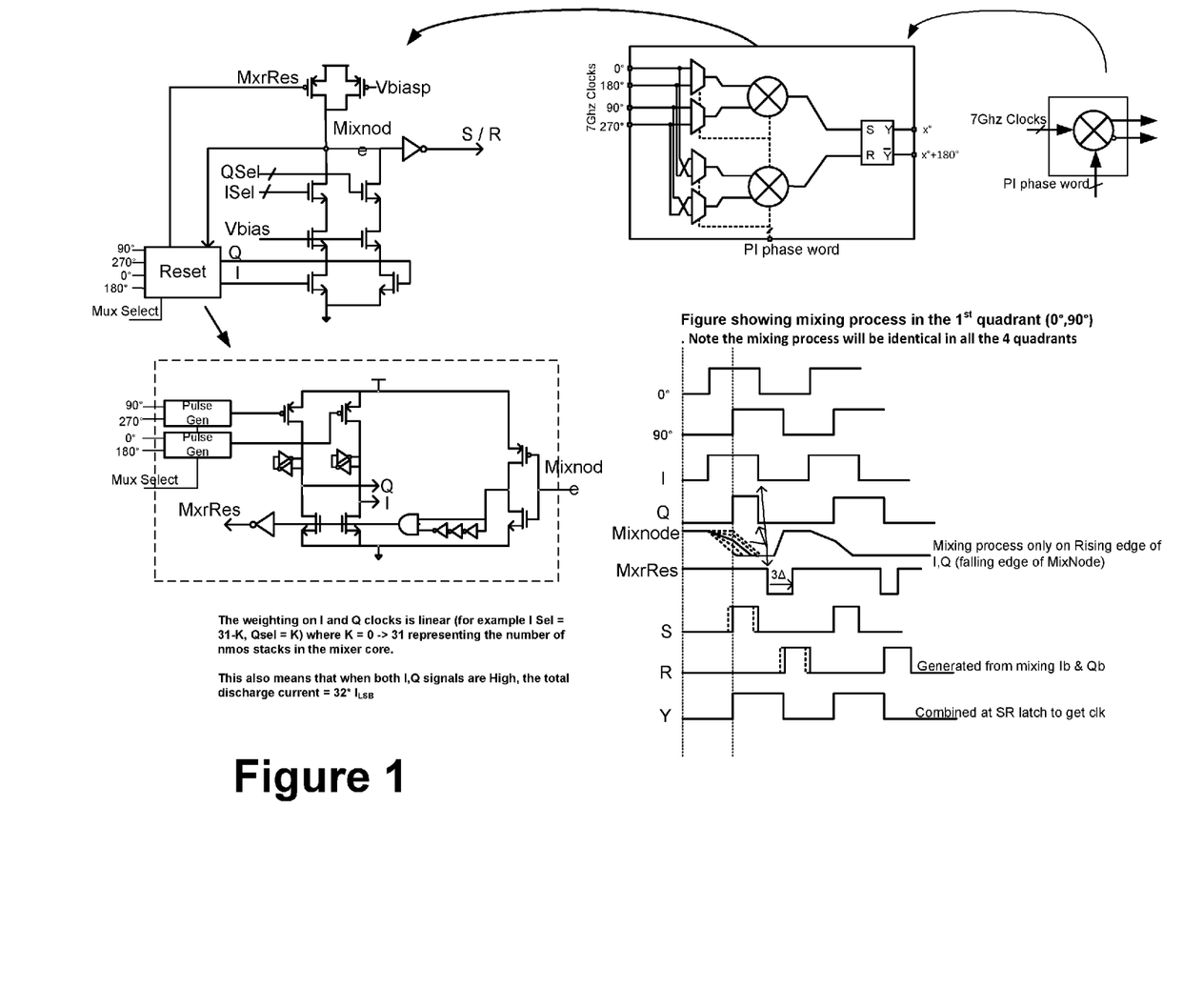
FIG. 1 is a simplified block diagram of a phase interpolator device according to an embodiment of the present invention.

FIG. 1 is a simplified block diagram of a phase interpolator device according to an embodiment of the present invention. In an example, the present phase interpolator device comprises a first PI core and a second PI core coupled to the first PI core. As shown, the first PI core is configured to interpolate from a first rising edge from a first clock and a second rising edge from a second clock. In an example, the second PI core being configured to interpolate from a third rising edge from a third clock and a fourth rising edge from a fourth clock, where the terms first, second, third, and fourth do not necessary imply order. In an example, the device has a first set of multiplexers coupled to a first input of the first PI core and a second set of multiplexers coupled to a second input of the second PI core.

In an example, the device also has an SR latch device comprising a set (S) input and a reset R input. In an example, the S input is coupled to the second PI core that controls the R input. The output of the latch device comprises a Y and Y-Bar output. In an example, the device has an input for a digital word, where the input is coupled to the first PI core and the second PI core. Preferably, the Y and Y-Bar output of the latch device is operably responsive to each rising edge of the S input and the R input to output a clock signal having a fifty percent duty cycle on the Y and Y-Bar output.

In an example, the present invention provides a method of operating a telecommunication device. The method includes transferring a first clock signal and a second clock signal to a first PI core coupled to a second PI core. The first PI core is configured to interpolate from a first rising edge from the first clock signal and a second rising edge from the second clock signal. The method includes transferring a third clock signal and a fourth clock signal to the second PI core, which is configured to interpolate from a third rising edge from the third clock signal and a fourth rising edge from the fourth clock signal. The method also includes transferring information from the first PI core to an S input of an SR latch device and transferring information from the second PI core to an R input of the SR latch device. The method includes transferring a digital word to the first PI core and the second PI core and outputting a clock signal having a fifty percent duty cycle on the Y and Y-Bar from the latch device responsive to each rising edge of the S input and the R input. Of course, there can be variations.

In an example, the each of the first PI core and the second PI core is characterized by a resetting characteristic by a reset pulse during a conclusion of a mixing operation. Additionally, the input for the digital word is coupled to a digital logic generator configured to be asynchronously timed with the digital logic generator and each of the first PI core and the second PI core. Further details of the present techniques can be found throughout the present specification and more particularly below.

Figure 2:
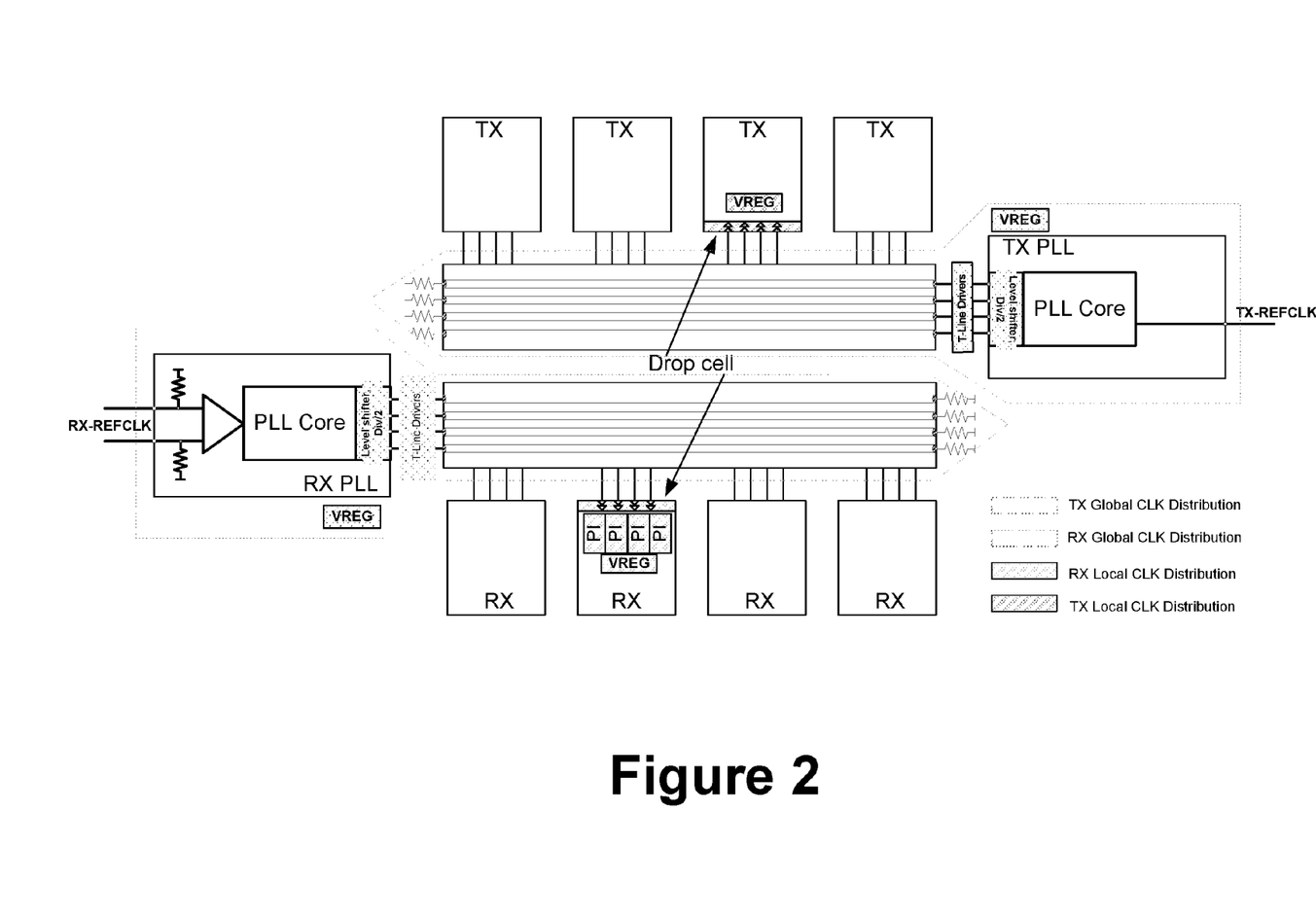
FIG. 2 is a simplified illustration of a transmitter and receiver configuration including the phase interpolator devices an embodiment of the present invention.

FIG. 2 is a simplified illustration of a transmitter and receiver configuration including the phase interpolator devices an embodiment of the present invention. As shown, the illustration includes a plurality of TX and RX modules, for transmit and receive processes. The illustration has line drivers, each corresponding to a plurality of channels. Each of the RX modules can include a plurality of receivers, as described, and phase interpolator devices configured to provide output signals based upon a binary word or input. Of course, there can be other variations, modifications, and alternative.

Figure 3:
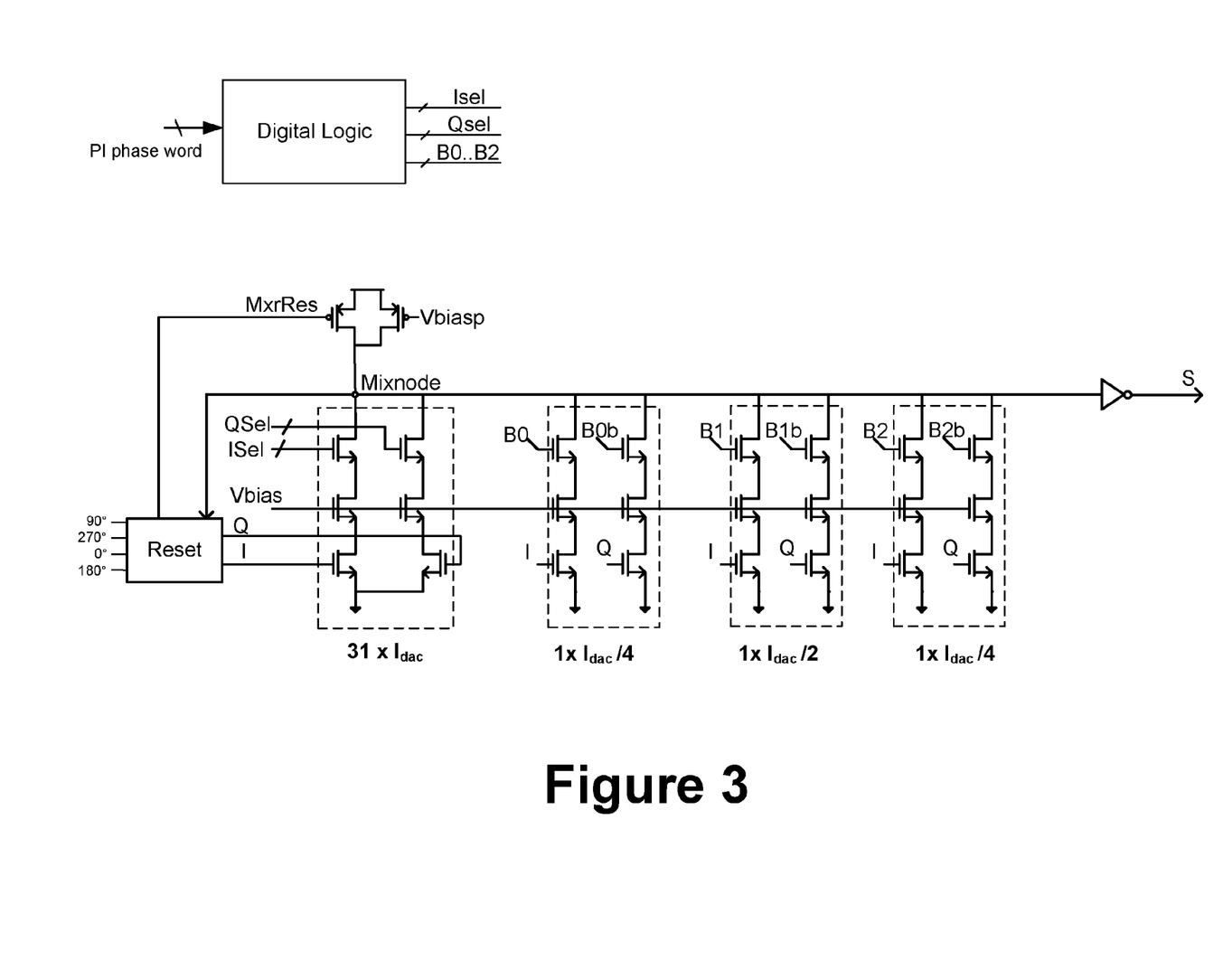
FIG. 3 is a simplified block diagram of a thermo setting configuration according to an embodiment of the present invention.

In an example, the present interpolator includes a mixer that mixes between two (2) clocks spaced 90° apart based on its 32 bit thermo setting, which has been described in more detail in FIGS. 1 and 3. The mixing process happens only on the rising edges of the input clock, which is performed to ensure rise to fall delay variations or duty cycle do not impact the performance of the mixer and do not contribute to the clock un-certainty at the end user in an example. As shown are the following techniques, in reference to the Figures:

2 sets of 2:1 multiplexers are included per PI core to ensure the mixer can select clocks from all 4 quadrants;
- A PI Core controls the Set input of the SR latch and creates the rising edge of the True clock (rise mixer);
- Another PI Core controls the Reset input of the SR latch and creates the rising edge of the Complement clock (fall mixer);
- The two PI Core's use the same digital word, except that their input clocks pertain to opposite quadrants 180° apart. Thus the set input and reset input to the SR latch are 180° apart. Also the output of each core is a pulse whose width is <<180° and ensures non-overlapping inputs to the SR Latch.

In an example, the mixing process in this architecture uses an I/C mixing (i.e. discharging by a fixed current). The mixer is assumed to be at a high state (mixnode) by the time rising edge of clocks arrive (I, Q). The total mixer discharge current is always fixed (Ilsb*128 where Ilsb=Idac/4). In an example, the mixer word allocates a fixed % of this current to I and the rest to the Q. For example a 100% weight on I or Q would start the discharge process as soon as the rising edge of that respective clock arrives.

A 50% weight would half this discharge current until both rising edges are seen when the discharge current reaches the total current of the DAC. Therefore, based on this weighting, a time dependent discharge rate is obtained which creates a delay which is a very linear function of the weighting factor (digital word). Whenever mixing node reaches a certain threshold low, the mixer generates a pulse that resets the input clocks to a low and the mixer core to a high state ready for the next mixing cycle. As shown in the Figure, the waveforms are shown for clarity and illustrative purposes.

It is possible for the reset signal to come too quickly and create a narrow pulse at the pi output. To mitigate this condition, a higher threshold on the inverter that drives the SR latch is used and the delay in the reset path also helps a valid high state develops at the inverter output. The reset also ensures that the output of the pi has a pulse width that is less than 180 Degrees.

Because of the pulsed nature of the PI, especially the reset, the mixer needs to be initialized on start up (mixnode→Vdd, I, Q→vss). This sets the correct stable operating point for this self-resetting mixer. Since the clocks are active on start up by the time PI is enabled asynchronously. It is often difficult for the resets to self-heal and arrive at the correct stable operating condition. To avoid this problem, the mixer is always enabled with 100% weight on start up and then switched to its correct digital code.

In an example, there are also pulse generators present on the inputs which generates pulses <<180° at its outputs. The 2:1 multiplexer functionality is also included in the pulse generators itself. The reason for these are (one or more of): (1) make PI insensitive to duty cycle of the incoming clocks; (2) to be able to reset the mixer any time after mixing completes; (3) be able to asynchronously switch the input multiplexers without having to worry about the mixer core operation. Of course, there can be variations.

If the pulse generators are not used, the one would have to wait till both inputs clocks go low (i.e., overlapping low signal). This leaves with very little time for the reset circuitry (at 7 Ghz, this is 17 ps) to perform the mixer reset. And also when the input multiplexers get switched, an overlapping low signal may not be present on both clocks for 1 cycle and creates a missing pulse. The above techniques avoid all or improve these limitations and make it insensitive to the inputs.

In an example, a static reset signal is provided to the SR latch to set it to the low state on start up. In an example, our result on the extracted version of the mixer shows the INL and DNL which are indicators of the mixer linearity, which is desirable.

In an example, the present techniques, and in particular the interpolator, use thermo codes, PI step size, and code skew as will be described in more detail throughout the present specification and more particularly below, and in reference to FIG. 3. The PI Core uses 31 thermometer weights and 3 binary weights for each for I and Q. Thus 31 Thermometer coded wires and its complement and 3 binary and complements are required to switch all the DAC weight from I to Q or Q to I. It is to be noted that though there are 3 binary bits, the 3rd binary bit has only a 1 LSB weight and is not a true b2 binary bit. This bit is introduced to only get an extra state to make the total PI codes an even number of steps (odd number of states) so that the quadrant is divided by an even number. The table below shows the example for a 3 thermo and 3 binary case of a phase interpolator rotator and can be extended to a 31 thermo rotator. Note the addition of B2 makes a 16 step rotator which otherwise would have had only 15 steps in the example. By extension, the technique achieves 28 steps from 31 thermo and the same 3 binary bits. In an example, thus the DAC enables 128 distinct steps (129 distinct levels or states). This sets the resolution or step-size of the phase interpolator. Also this makes it easy for the CDR arithmetic to space the phase interpolator to get quadrant spacings that have no or little systematic quadrature error. Thus phase interpolator Resolution for the technique is 90°/128=0.703125° or 279.01785 fs at a 7 Ghz clock rate.

In an example, the digital word for the phase interpolator control the position of the 8 output clocks to the samplers. The 4 PI words are offset by 64 from each other to get the 45° offset b/w the phases. This is done by the CDR module in the RXD. The following table shows the codes and expected phase outputs. One of the key requirements is that the multiplexer changes happen only when the mixer does not have any weight on a clock. There are multiple ways to address this quadrant switch. The CDR logic implements the phase interpolator change rules to ensure multiplexer is switched with 0 or 100% weights only. Note the quadrant switching when moving up and down have to ensure the multiplexer change happens before the mixer can enter into the new quadrant. A couple of clock cycles is a good delay between multiplexer switches and code change in the new quadrant.

In an example, due to the binary and thermometer combination in the phase interpolator codes, the phase rotator imposes restrictions on the skew between binary and thermo codes. If the skew is too large, then when a binary—thermo boundary is reached, all the binary will switch early or late to the thermo switch and this can cause a momentary glitch for 1 clock cycle of the rotator (assuming this skew <<1 PI Clock cycle). Due to the 8 phases present, synchronizing the phase interpolator digital code and multiplexer change to the local pi clocks is very difficult and makes the interface quite complex. To avoid this, care is taken in the phase interpolator to be able to asynchronous switch the codes given a certain max skew b/w the codes.

In an example, the simulations show a 5 ps skew can cause a 400 fs momentary glitch during the worst position code switch. The phase interpolator will assume 10 ps for skew between any binary and any thermo code. This skew number is based on digital routing experiments. The phase interpolator also allows for the rotator codes to be jumped by 1 LSB (279 fs), 2 LSB (558 fs), or 4 LSB (1.116 ps) without any special requirements to the rotator. Based on the example table below, we can see that the skew requirements get relaxed in the 2 LSB and 4 LSB cases. When Jumping by 2 LSB case, the code change b/w thermo and binary only happens for Bit B1 and Tx. In case of jumps by 4 LSB, the binary codes stays 00 always when the thermo bits change—hence no skew relationship b/w binary and thermo is forced. At quadrant boundaries, the binary bits go from all 0 to all 1's such that the skew requirement is only between the binary bits. Further details of the present techniques can be found throughout the present specification and more particularly below.

Figure 4:
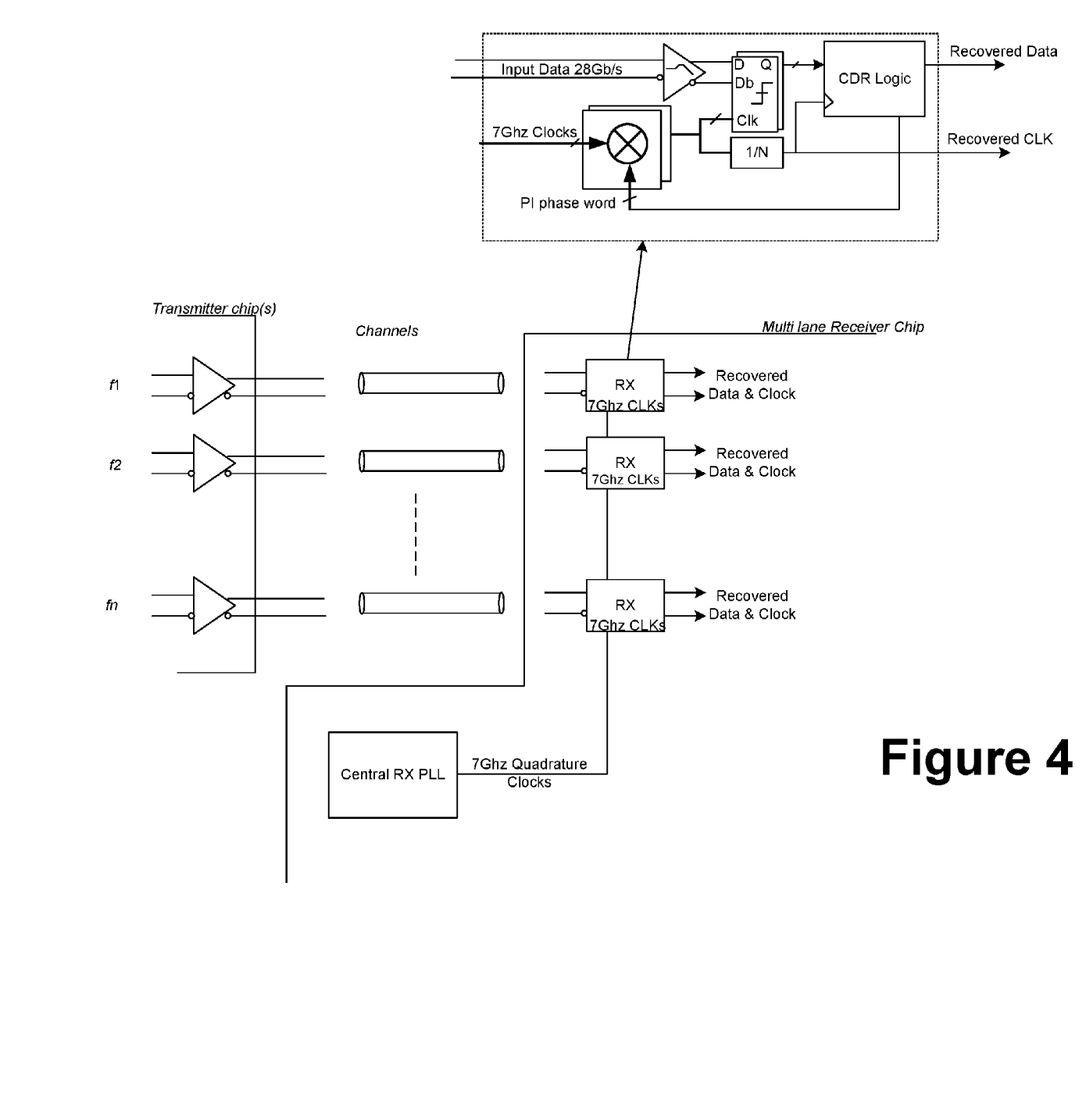
FIG. 4 is a simplified illustration of a phase interpolator device configured in a plurality of receivers for communication channels in a communication integrated circuit device according to an embodiment of the present invention.

FIG. 4 is a simplified illustration of a phase interpolator device configured in a plurality of receivers for communication channels in a communication integrated circuit device according to an embodiment of the present invention. In an example, the present invention provides an integrated transceiver circuit device. The device has a plurality of receivers coupled to a plurality of channels. Each of the channels is configured for transmitting asynchronous data to one of the receivers. Each of the receivers has a pre-amplifier device having an input and an output. The input is coupled to a channel associated with the receiver. The device has a comparator device comprising an input coupled to the pre-amplifier, and configured to identify one or more binary states, and a phase interpolator device coupled to a receiver of the comparator device. The phase interpolator device is configured to perform a digital to phase conversion using information from the one or more binary states. The phase interpolator device comprises a first PI core and a second PI core coupled to the first PI core, a first set of multiplexers coupled to a first input of the first PI core and a second set of multiplexers coupled to second input of the second PI core, and a latch device comprising a set (S) input and a reset R input, the S input being coupled to the second PI core that controls the R input. In an example, the latch device comprises a Y and Y-Bar output. The device also has an input for a digital word, the input being coupled to the first PI core and the second PI core. The device has a clock data recovery (CDR) device coupled to an output of the comparator device and configured to drive the phase interpolator device to synthesize a frequency and phase of a signal from the output. The device has a PLL device, the PLL device being common to and being coupled to each of the phase interpolator devices.

It is to be appreciated that phase interpolator devices (e.g., PI device illustrated in FIG. 1) according to embodiments of the present invention provide both high performance and lower power consumption. More specifically, phase interpolator devices according to embodiments of the present invention provides high linearity, high speed, and low noise, thereby making them useful in high-speed data communication applications. As described below, by using a single PI core instead of two for a phase interpolator device, power consumption is further reduced. For example, signal at 180 degrees phase is provided by a delay line (e.g., a part of a delay-lock loop), which generates multiple phases for time-interleaved circuits.

Figure 5:
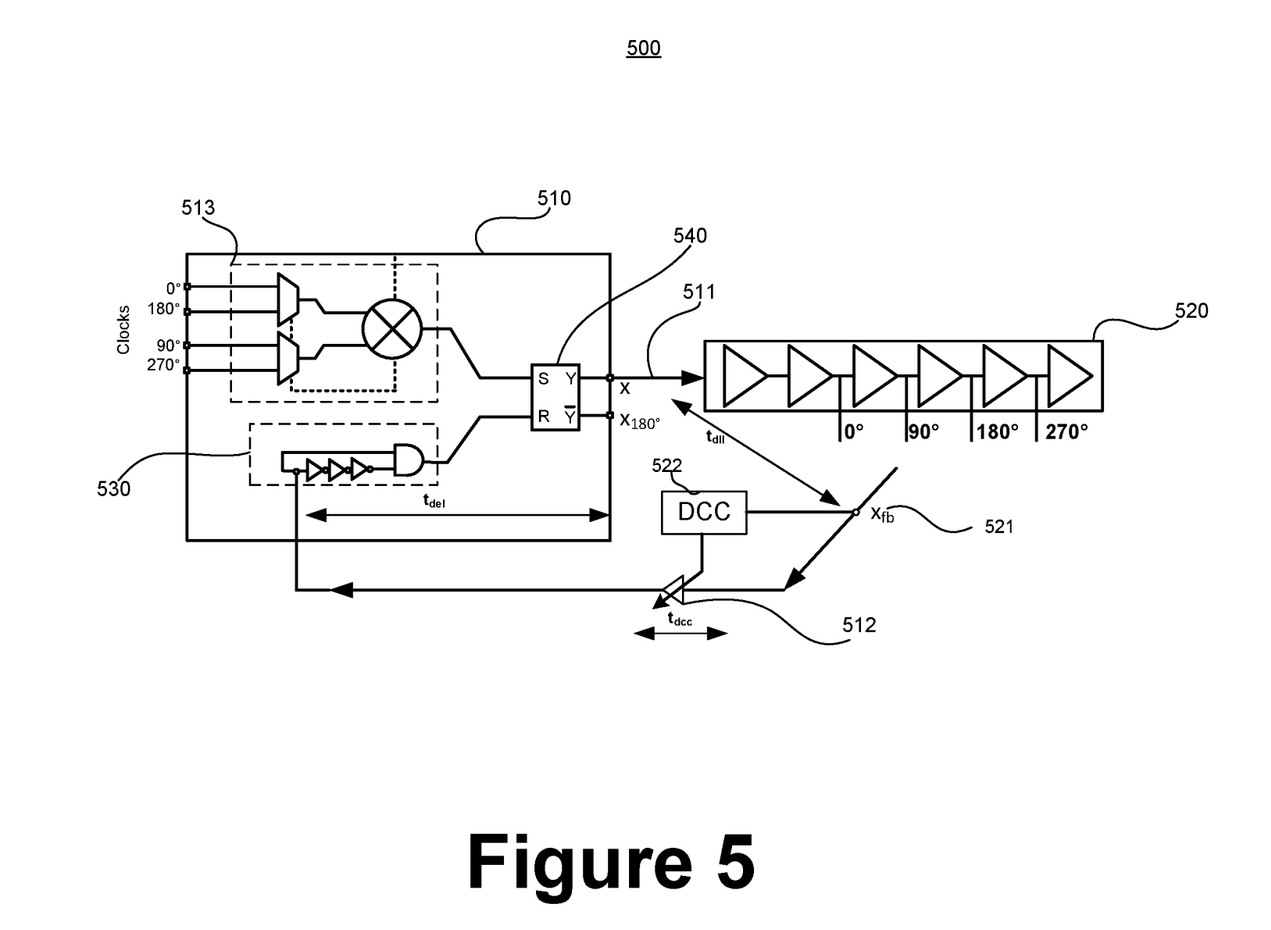
FIG. 5 is a simplified block diagram of a pulse amplified modulated (PAM) system configured with a phase interpolator device according to an embodiment of the present invention.

FIG. 5 is a simplified block diagram of a phase interpolator device 500 according to an embodiment of the present invention. This diagram is merely an example, which should not unduly limit the scope of the claims. One of ordinary skill in the art would recognize many variations, alternatives, and modifications. The phase interpolator device 500 includes a phase interpolator (PI) core 513. The PI core 513 is configured to interpolate from a first rising edge from a first clock and a second rising edge from a second clock. In various embodiments, the first clock and the second clock operate at a relatively high frequency (e.g., 7 GHz or higher as described above). As an example, an implementation of the PI core 513 is illustrated in FIG. 6.

Figure 6:
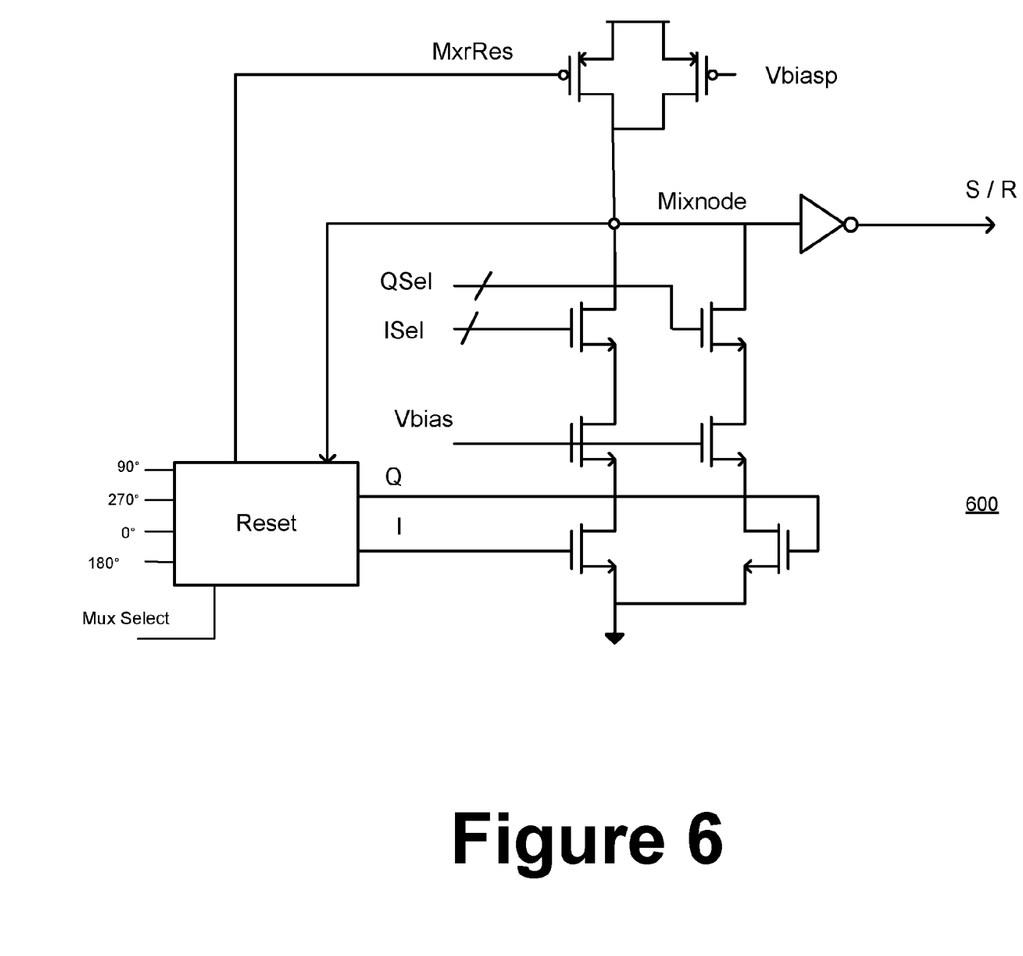
FIG. 6 is a simplified diagram illustrating a PI core according to an embodiment of the present invention.

FIG. 6 is a simplified diagram illustrating a PI core according to an embodiment of the present invention. This diagram is merely an example, which should not unduly limit the scope of the claims. One of ordinary skill in the art would recognize many variations, alternatives, and modifications. A shown in FIG. 6, the PI core 600 comprises a reset. For example, the PI core 600 is characterized by a resetting characteristic by a rest pulse during a conclusion of a mixing operation. The input of the digital word is coupled to a digital logic generator configured to be asynchronously timed with the digital logic generator. For example, various implementations of the PI core is described in other sections of this application.

Now referring back to FIG. 5. Among other things, the PI core 513 is configured to generate pulses that drives the SR latch 540. The pulse generation is based on clock inputs at 0, 180, 90 and 270 degrees as shown in FIG. 6. The device 500 also includes an SR latch 540. The SR latch 540 as shown includes a set (S) input and a reset (R) input. The signal for the S input of the SR latch is received from the output of the PI core 513. The signal for the R input of the SR latch is received from the pulse generator 530. For example, the different between the S input and the R input is about 50% duty cycle (or 180 degrees phase shift), and the outputs of the pulse generator 530 and the PI core 513 are thus specifically configured to be different from each other by 50% duty cycle, or 180 degrees in phase. In various embodiments, the pulse generator 530 is implemented as a part of delay loop 521 that is specifically calibrated to provide pulse signals that is 50% duty cycle away from the output of PI core 513. In various embodiments, pulse generator 530 is characterized by a delay $t_{del}$, which is less than a 180 degree phase.

The outputs of the latch device 540, as shown in FIG. 5, comprise a Y output and a Y-Bar output. For example, the Y and Y-Bar outputs of the latch device 540 are operably responsive to each rising edge of the S input and the R input to output a clock signal having a 50% duty cycle on the Y and Y-Bar output. An output of the latch device 540 is coupled to the delay line 520. For example, the delay line 520 is a part of the delay-lock loop. The delay line 520 comprises a plurality of delay stages configured at different phases. For example, as shown in FIG. 5, the delay line 520 is configured to provide output at different phases, including 0, 90, 180, and 270 degrees. Depending on the implementation, the delay line 520 may include additional output phases as well (e.g., separation by ⅛ of duty cycle or 45 degrees). One of the delay line 520 outputs is coupled to the R input of the SR latch 540 as a part of delay loop 521 ($X_{fb}$). For example, the amount of delay from the delay line is characterized by a delay $t_{dll}$. An objective of the delay loop 521 and the pulse generator 530 is to provide an input signal to the R input that is 180 degrees (or half duty cycle) off from the output of the PI core 513. So, the total delay from the delay line 520 and the pulse generator 530 is $t_{del}+t_{dll}$, which is less than 180 degrees. To provide the 180 degrees phase shifted needed for the R input at the SR latch 540, an adjustable delay module 512 is provide and is connected to the delay line 520 and the pulse generator 530, as a part of the delay loop. The delay module 512 is characterized by a delay $t_{dcc}$, which can be adjusted to provide the needed delay. More specifically, since the total delay between the output of the SR latch 520 and its R input is $t_{dll}+t_{dcc}+t_{del}$, to obtain the 180 degrees of phase shift needed, the delay from the delay module is set to $t_{dcc}=180-(t_{dll}+t_{del})$. For example, the delay module 512 is controlled by control module 522, which is configured to adjust $t_{dcc}$ based on $t_{dll}$ and/or $t_{del}$. In various embodiments, the delay module 512 and the control module 522 are implemented using low-power components, as the amount of delay needed from $t_{dcc}$ is typically small. For the purpose of power efficiency, most of the 180 degrees of phase shift is obtained from the delay line 520. For example, delay line 520 may provide 150 degrees of phase shift, and the delay module 512 only needs to come up with less than 30 degrees of phase shift.

Depending on the implementation, the 180 degrees phase shifted for the input R of the SR latch can be provided in different ways. For example, two or more outputs from the delay line 520 may be used in lieu of (or in combination with) the delay module 512. In a specific embodiment, delay $t_{del}$ from the pulse generator 530 is negligible, and the 180 degrees delay output from the delay line 520 is used.

Figure 7:
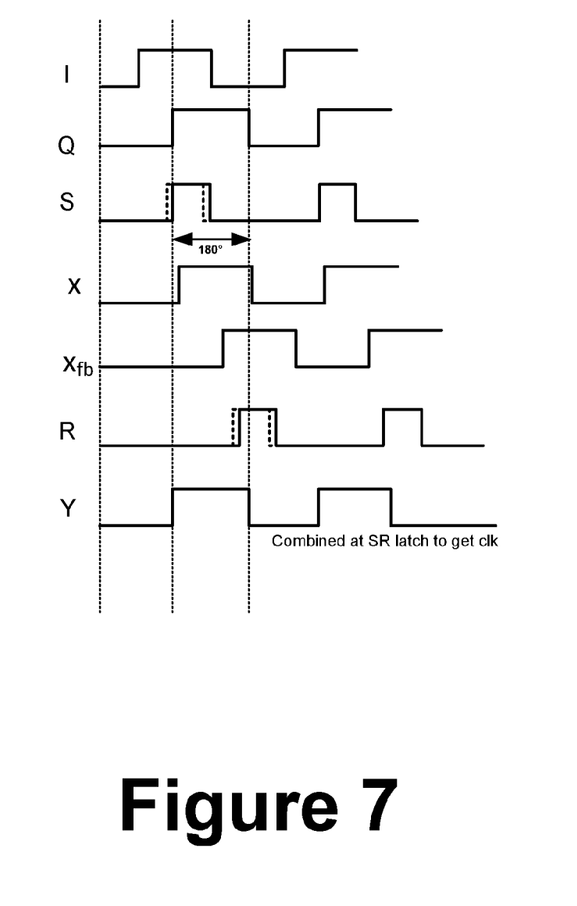
FIG. 7 is a timing diagram illustrating operation of a phase generator according to an embodiment of the present invention.

FIG. 7 is a timing diagram illustrating operation of a phase generator according to an embodiment of the present invention. This diagram is merely an example, which should not unduly limit the scope of the claims. One of ordinary skill in the art would recognize many variations, alternatives, and modifications. For example, the timing diagram shown in FIG. 7 illustrates operation of the phase interpolator 500 in FIG. 5. As can be seen FIG. 7, input S and input R of the SR latch are separate by a phase shift of 180 degrees (or half duty cycle).

Figure 8:
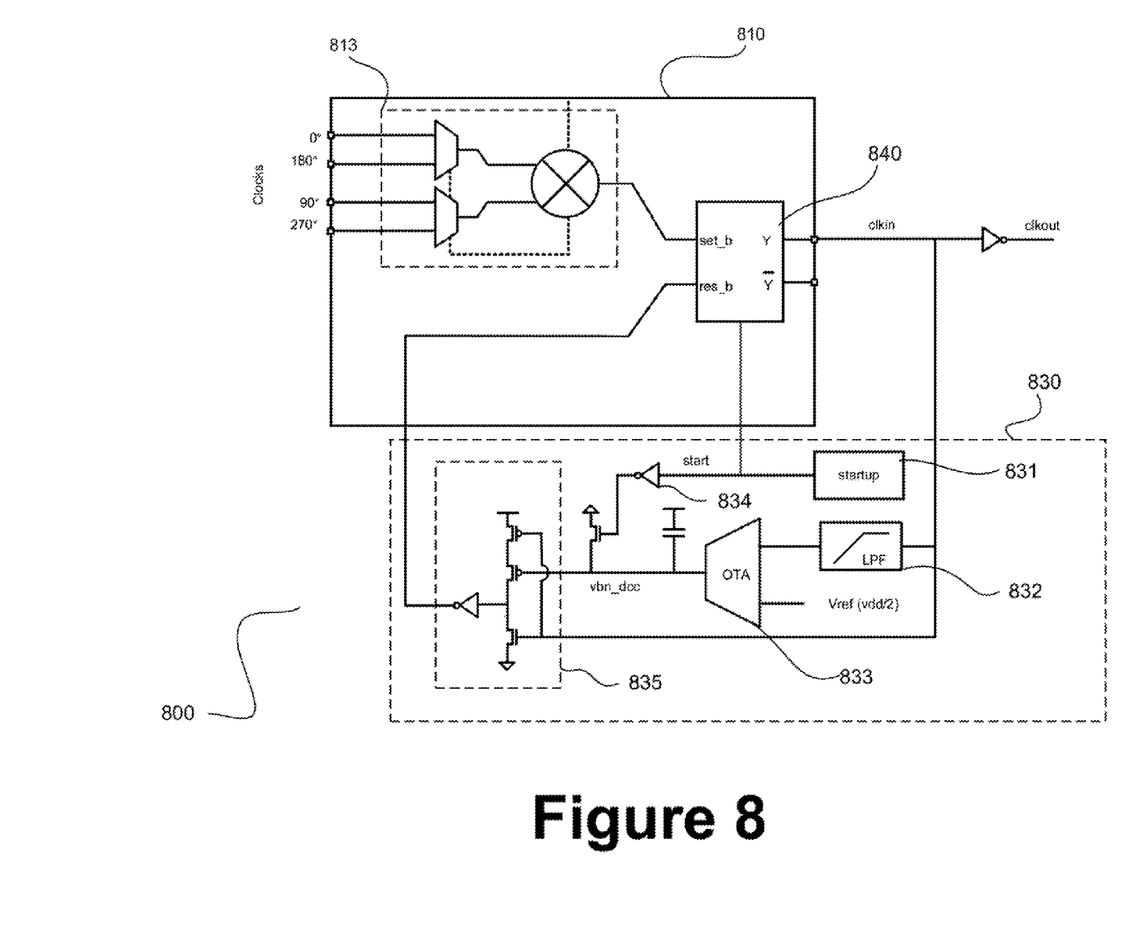
FIG. 8 is a simplified diagram illustrating a phase interpolator device 800 according to an embodiment of the present invention.

FIG. 8 is a simplified diagram illustrating a phase interpolator device 800 according to an embodiment of the present invention. This diagram is merely an example, which should not unduly limit the scope of the claims. One of ordinary skill in the art would recognize many variations, alternatives, and modifications. The phase interpolator device 800 includes a phase interpolator (PI) core 813. The PI core 813 is configured to interpolate from a first rising edge from a first clock and a second rising edge from a second clock. In various embodiments, the first clock and the second clock operate at a relatively high frequency (e.g., 7 GHz or higher as described above). As an example, an implementation of the PI core 813 is illustrated in FIG. 6. Among other things, the PI core 813 is configured to generate pulses that drives the SR latch 840. The pulse generation is based on clock inputs at 0, 180, 90 and 270 degrees as shown in FIG. 6. The SR latch 840 as shown includes a set (S) input and a reset (R) input. The signal for the S input of the SR latch 840 is received from the output of the PI core 813. The signal for the R input of the SR latch is received from feedback loop 830. For example, the difference between the S input and the R input is about 50% duty cycle (or 180 degrees phase shift), and the outputs of the feedback loop 830 and the PI core 813 are thus specifically configured to be different from each other by 50% duty cycle, or 180 degrees in phase.

The outputs of the latch device 840, as shown in FIG. 5, comprise a Y output and a Y-Bar output. For example, the Y and Y-Bar outputs of the latch device 840 are operably responsive to each rising edge of the S input and the R input to output a clock signal having a 50% duty cycle on the Y and Y-Bar output. The phase difference of 50% duty cycle between Y and Y-Bar output is provided by the feedback loop 830.

The feedback loop 830 includes a startup module 831, which provides a "start" signal as shown. In a specific implementation, the startup module 831 is implemented as a part of the PI core 813, which indicates when the feedback loop 830 is turned on. In certain embodiments, the startup module 831 is a part of the feedback loop 830 and provides the "start" signal in response to a control signal received from an external module. For example, as the "start" signal is turned on, the output from inverter 834 is low, which allows the "vbn_dcc" voltage to ramp up.

Figure 9:
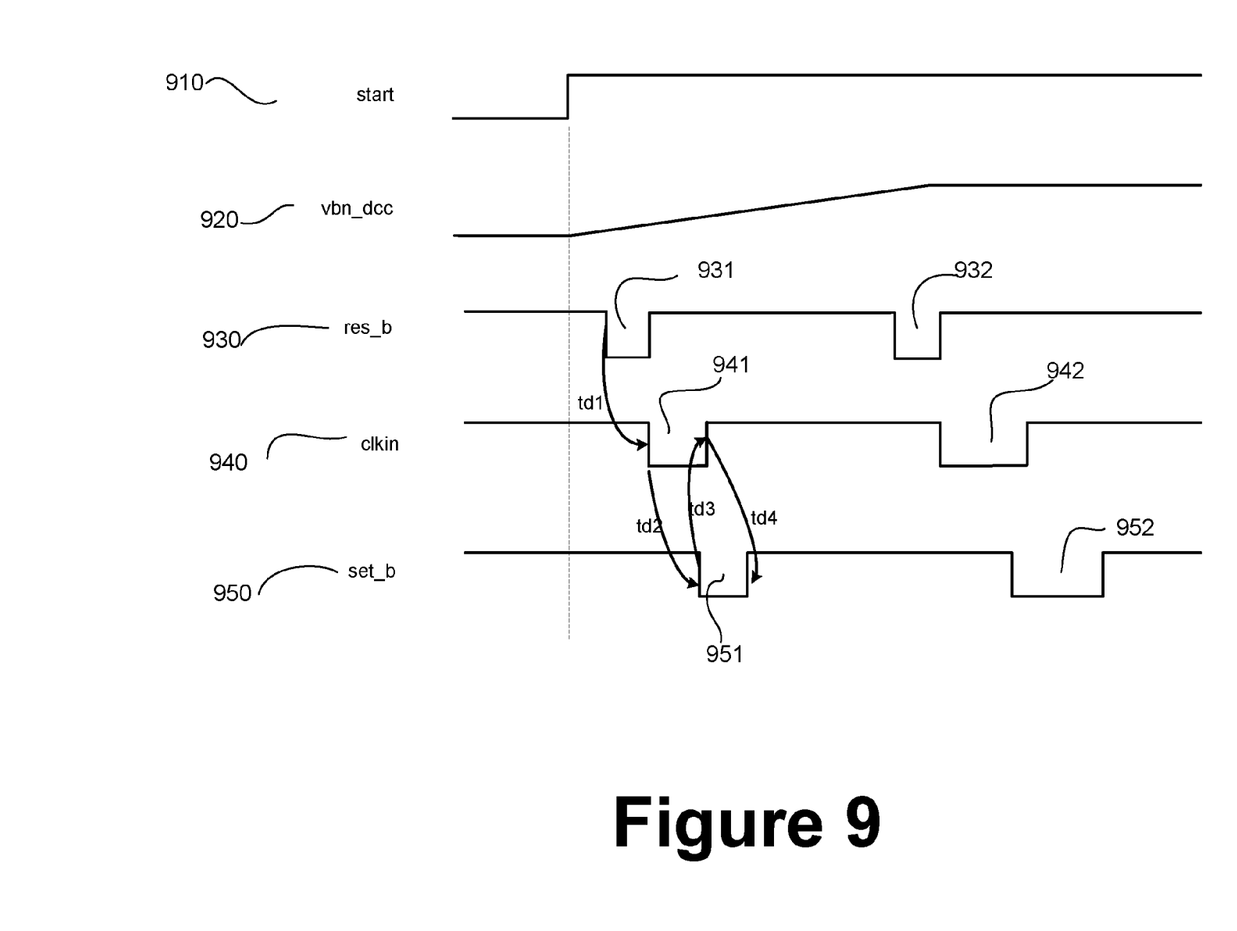
FIG. 9 is a simplified timing diagram illustrating the operation of the PI device 800 according to embodiments of the present invention.

FIG. 9 is a simplified timing diagram illustrating the operation of the PI device 800 according to embodiments of the present invention. This diagram is merely an example, which should not unduly limit the scope of the claims. One of ordinary skill in the art would recognize many variations, alternatives, and modifications. As can be seen in FIG. 9, "vbn_dcc" starts ramping up when "start" signal changes from low to high. The "start" signal from the startup module 831 is represented by waveform 910. The waveform 920 corresponds to the OTA 833 output. The waveform 930 of "res_b" corresponds to the output of the PI core 813, which is the reset input of the latch 840. The waveform 940 corresponds to the "Y" output of the SR latch 840. Waveform 950 corresponds to output of the feedback loop 830 and the "set_b" input of the SR latch 840. As seen in FIG. 9, as "start" waveform changes from low to high (i.e., start signal turning on), the "vbn_dcc" waveform 920 starts ramping up. The relatively slow slew rate of the "vbn_dcc" extends the pulses width of the "clkin" and "set_b" signals.

Now referring back to FIG. 8. The Y output of the latch 840 is the "clkin" signal. The "clkin" signal is delayed by an interval "td1" from the "res_b" signal as shown in FIG. 9. For example, the delay between "res_b" and "clkin" is introduced by the SR latch 840. The "clkin" signal becomes "clkout" signal once inverted, as shown. The "clkin" signal is provided to the feedback loop 830, and is processed by the low-pass filter (LPF) 832. The LPF 832 extracts the DC voltage of the "clkin" signal, which as shown in FIG. 9 comprises short pulse signals outputted by the SR latch 840. The operational transconductance amplifier (OTA) 833 compares the output of the LPF 832 to a reference voltage "Vref", which is half of the Vdd voltage. For example, reaching half or 50% of the Vdd voltage means Y output of the SR latch 840 is at 50% duty cycle. More specifically, if the output voltage of the LPF 832 is equal to or greater to 50% of the Vdd voltage, the OTA 833 and the "clkin" signal causes the switching section 835 to output a low signal (as shown in FIG. 9) as the "set_b" signal. For example, the Vdd voltage is the drain voltage of the CMOS switch. The "set_b" signal is then used to change the "clkin" signal at the SR latch 840. The time interval between the feedback loop 830 receiving "clkin" signal as input signal and outputting the "set_b" as an output signal is "td2", which corresponds to the time it takes for the "clkin" signal to go through the feedback loop 830, which includes various components and switches as shown. The falling edge of the "set_b" signal then triggers a rising edge of "clkin" signal, with a delay of "td3". The rising edge of the "clkin" signal then, through the feedback loop 830, causes a rising edge of the "set_b" signal, after a delay "td4", which is associated with the signal going through the feedback loop.

As can be seen in FIG. 9, a single duty cycle is between the falling edges of the pulse 931 and pulse 932, which are generated by the PI core. The pulse width of the "res_b" signal is substantially less than 50% of the duty cycle. As explained above, an objective is to provide a signal to "set_b" that is phase 180 degrees or 50% of the duty cycle. While the switches (e.g., at section 835) and LPF 832 add some (mostly negligible) delay, most of the between "clkin" and "set_b" is produced by the LPF 832 and the OTA 833, as the DC voltage of the "clkin" charges up to the Vref, which is specifically set to half of VDD railting voltage and corresponds to 50% duty cycle. When the "res_b" signal is at its second pulse 932, the corresponding "clkin" pulse 942 is extended, and as a result the falling edge of the "set_b" pulse 952 starts at a later phase of the second duty cycle than falling edge of the pulse 951. Within a relatively few cycles, the falling edges of "set_b" pulses correspond the falling edge of the "res_b" pulses with a phase difference of about 180 degrees or 50% duty cycle.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A system comprising:
an integrated transceiver circuit device comprising:
a plurality of receivers coupled to a plurality of channels, each of the channels being configured for transmitting asynchronous data to one of the receivers, each of the receivers comprising:
a pre-amplifier device having an input and an output, the input being coupled to a channel associated with a receiver;
a comparator device comprising an input coupled to the output of the pre-amplifier device, and configured to identify one or more binary states;
a phase interpolator device coupled to the comparator device, the phase interpolator device being configured to perform a digital to phase conversion using information from the one or more binary states, the phase interpolator device comprising a phase interpolator core, a set-reset (SR) latch and a feedback loop, the SR latch comprising a set (S) input, a reset (R) input, and an output, the S input being configured to receive signals from the phase interpolator core, the feedback loop being coupled between the output of the SR latch and the R input, the feedback loop being characterized by a phase shift of about 180 degrees, the feedback loop including an operational transconductance amplifier (OTA) for generating a switching signal, the switching signal being associated with the R input; and
a clock data recovery (CDR) circuit coupled to an output of the comparator device and configured to drive the phase interpolator device to synthesize a frequency and phase of a signal from the output of the comparator device; and
a phase lock loop (PLL) device, the PLL device being common to and being coupled to each of the phase interpolator devices in the plurality of receivers; and
a storage system coupled to integrated transceiver circuit device.

2. The system of claim 1 wherein the comparator device further comprises a plurality of comparator devices, each of the plurality of comparator devices is coupled to the CDR circuit, each of the plurality of comparator devices being coupled to a separate phase interpolator device associated with the phase interpolator devices.

3. The system of claim 1 wherein the phase interpolator device is characterized using a complimentary metal-oxide semiconductor (CMOS) interpolation that is linear (INL) and is provided to track jitter.

4. The system of claim 1 wherein the phase interpolator device is characterized by a phase linearity and a dynamic performance; and
Wherein the phase interpolator device is characterized by a current based mixing to achieve a substantial linearity in a phase to digital code relationship, wherein the phase interpolator device is configured using a CMOS level.

5. The system of claim 1 wherein the plurality of receivers are coupled to a serializer/deserializer (SerDes) device, and coupled to a plurality of transmitters; and
wherein the phase interpolator device is characterized by a CMOS level on an interpolated output.

6. The system of claim 1 wherein the phase interpolator core comprises a pair of mixers configured to mix a first clock and a second clock spaced by 90 Degrees from each other.

7. A system comprising:
an integrated transceiver circuit device comprising:
a plurality of receivers coupled to a plurality of channels, each of the channels being configured for transmitting asynchronous data to one of the receivers, each of the receivers comprising:
a pre-amplifier device having an input and an output, the input being coupled to a channel associated with a receiver;
a comparator device comprising an input coupled to the output of the pre-amplifier device, and configured to identify one or more binary states;
a phase interpolator device coupled to the comparator device, the phase interpolator device being configured to perform a digital to phase conversion using information from the one or more binary states, the phase interpolator device comprising a phase interpolator core, a set-reset (SR) latch and a feedback loop, the SR latch comprising a set (S) input, a reset (R) input, and an output, the S input being configured to receive signals from the phase interpolator core, the feedback loop being coupled between the output of the SR latch and the R input, the feedback loop being characterized by a phase shift of about 180 degrees, the feedback loop including an operational transconductance amplifier (OTA) for generating a switching signal, the switching signal being associated with the R input; and a clock data recovery (CDR) circuit coupled to an output of the comparator device and configured to drive the phase interpolator device to synthesize a frequency and phase of a signal from the output of the comparator device; and a phase lock loop (PLL) device, the PLL device being common to and being coupled to each of the phase interpolator devices in the plurality of receivers;

a storage system coupled to integrated transceiver circuit device; and a network coupled to the storage system.

8. The system of claim 7 wherein the comparator device further comprises a plurality of comparator devices, each of the plurality of comparator devices is coupled to the CDR circuit, each of the plurality of comparator devices being coupled to a separate phase interpolator device associated with the phase interpolator devices.

9. The system of claim 7 wherein the phase interpolator device is characterized using a complimentary metal-oxide semiconductor (CMOS) interpolation that is linear (INL) and is provided to track jitter.

10. The system of claim 7 wherein the phase interpolator device is characterized by a phase linearity and a dynamic performance; and Wherein the phase interpolator device is characterized by a current based mixing to achieve a substantial linearity in a phase to digital code relationship, wherein the phase interpolator device is configured using a CMOS level.

11. The system of claim 7 wherein the plurality of receivers are coupled to a serializer/deserializer (SerDes) device, and coupled to a plurality of transmitters; and wherein the phase interpolator device is characterized by a CMOS level on an interpolated output.

12. The system of claim 7 wherein the phase interpolator core comprises a pair of mixers configured to mix a first clock and a second clock spaced by 90 Degrees from each other.

* * * * *